United States Patent [19]
Suzu et al.

[11] Patent Number: 6,108,247
[45] Date of Patent: Aug. 22, 2000

[54] VOLTAGE GENERATION CIRCUIT FOR MULTIVALUED CELL TYPE MASK ROM

[75] Inventors: Takayuki Suzu; Kenji Hibino, both of Tokyo, Japan

[73] Assignee: NEC Corporation, Tokyo, Japan

[21] Appl. No.: 08/971,564

[22] Filed: Nov. 17, 1997

[30] Foreign Application Priority Data

Nov. 15, 1996 [JP] Japan .................................. 8-320827

[51] Int. Cl.$^7$ .................................................. G11C 16/04
[52] U.S. Cl. .............................. 365/189.11; 365/189.09; 365/230.06; 365/230.08
[58] Field of Search ................................. 365/189.11, 94, 365/104, 189.08, 189.09, 210, 226, 230.08, 230.06

[56] References Cited

U.S. PATENT DOCUMENTS

| | | | |
|---|---|---|---|
| 4,912,674 | 3/1990 | Matsumoto et al. | 365/104 |
| 5,278,786 | 1/1994 | Kawauchi et al. | 365/185 |
| 5,559,737 | 9/1996 | Tanaka et al. | 365/185.25 |
| 5,761,149 | 6/1998 | Suzuki et al. | 365/230.03 |
| 5,838,629 | 11/1998 | Kohno | 365/230.06 |

*Primary Examiner*—David Nelms
*Assistant Examiner*—Hien Nguyen
*Attorney, Agent, or Firm*—Sughrue, Mion, Zinn, Macpeak & Seas, PLLC

[57] ABSTRACT

A voltage generation circuit for a multivalued cell type mask ROM includes partial circuits of the same number as the row number of memory cell transistors. Each of the partial circuits includes a cell part circuit, which includes a memory cell transistor and a resistor, which is formed to have the same resistance as the resistance parasitically added to a source and a drain of a memory cell transistor. Each of the partial circuits is supplied with the same signal as the signal supplied to a corresponding word line, so that the partial circuit corresponding to the word line of a selected memory cell transistor is selected to generate a voltage interlocked with a variation in the threshold caused by a difference between the source potential and the substrate potential.

5 Claims, 8 Drawing Sheets

VOLTAGE GENERATION CIRCUIT FOR MULTIVALUED CELL TYPE MASK ROM

BACKGROUND OF THE INVENTION

1. Field of the Invention

The present invention relates to a voltage generation circuit, and particularly, to a voltage generation circuit for a mask-programmed read only memory (called a "mask ROM" hereinafter) configured to store information of three or more values in one bit, namely in one memory cell.

2. Description of Related Art

In order to elevate the integration density in the mask ROM, a multivalued cell has been proposed which can store the information amount of more than two values, in one memory cell transistor. For example, Japanese Patent Application Pre-examination Publication No. JP-A-62-204496 proposed a multivalue semiconductor memory, which includes a voltage generating circuit, a plurality of transistors, and a transistor receiving an output voltage of each of the plurality of transistors, for step-by-step increasing or decreasing the level of a word line, for the purpose of surely reading out the multivalued information stored in the memory cell.

FIG. 5 shows a block diagram of one example of the prior art circuit structure of an X decoder for a multivalued-cell type mask ROM. Referring to FIG. 5, the shown X decoder is constituted of a voltage generating circuit 501 and a word line decoding circuit 502.

The voltage generating circuit 501 includes a first reference voltage generating circuit 404, a first differential amplifying circuit 401, a first transfer gate circuit 504, a second reference voltage generating circuit 405, a second differential amplifying circuit 402, a second transfer gate circuit 505, a third reference voltage generating circuit 406, a third differential amplifying circuit 403, a third transfer gate circuit 506, and a first NMOS transistor Q507 for discharging, to a ground level, an output OUT501 (an output of the voltage generating circuit) which is connected in common to respective outputs of the first to third transfer gate circuits 504 to 506.

On the other hand, the word line decoding circuit 502 includes a fourth transfer gate circuit 507, a second NMOS transistor Q510 for discharging an output of the fourth transfer gate circuit 507 to the ground level when it is not selected, a fifth transfer gate circuit 508, a third NMOS transistor Q513 for discharging an output of the fifth transfer gate circuit 508 to the ground level when it is not selected, a sixth transfer gate circuit 509, a fourth NMOS transistor Q516 for discharging an output of the sixth transfer gate circuit 509 to the ground level when it is not selected. The outputs of the fourth to sixth transfer gate circuits 507 to 509 are connected to word lines WL501 to WL503, respectively.

FIG. 4 shows a detailed circuit construction of the voltage generating circuit 501. The first reference voltage generating circuit 404 is constituted of a first PMOS transistor Q401 and a fifth NMOS transistor Q402. The first PMOS transistor Q401 has a source terminal connected to a power supply terminal VCC, a gate terminal connected to receive an inverted chip enable signal CEB, and a drain terminal connected to an output CVOUT401 of the first reference voltage generating circuit 404. The fifth NMOS transistor Q402 has a source terminal connected to a ground terminal GND, and a gate terminal and a drain terminal connected in common to the output CVOUT401 of the first reference voltage generating circuit 404.

The first differential amplifying circuit 401 comprises a differential pair of transistors Q405 and Q406 having their respective sources connected in common to a constant current source transistor Q407, transistors Q403 and Q404 constituting a current mirror which acts as an active load for the differential pair, a transistor Q408 receiving an output of the differential pair, and a transistor Q409 connected in series with the transistor Q408 and rendered conductive when a non-inverted chip enable signal CE is active. One of a pair of inputs of the first differential amplifying circuit is connected to the output CVOUT401 of the first reference voltage generating circuit 404, and the other input of the first differential amplifying circuit is connected to receive an output VOUT401 of the differential amplifying circuit (voltage follower). Incidentally, the second and third differential amplifying circuits 402 and 403 are constituted similarly to the first differential amplifying circuit 401.

More specifically, the first differential amplifying circuit 401 includes a second PMOS transistor Q403, a third PMOS transistor Q404, a fourth PMOS transistor Q408, a sixth NMOS transistor Q405, a seventh NMOS transistor Q406, an eighth NMOS transistor Q407, and a ninth NMOS transistor Q409. Respective source terminals of the second PMOS transistor Q403, the third PMOS transistor Q404 and the fourth PMOS transistor Q408 are connected to the power supply terminal VCC. The second PMOS transistor Q403 has a gate terminal and a drain terminal connected in common to a terminal T401, and the third PMOS transistor Q404 has a gate terminal connected to the terminal T401, and a drain terminal connected to a terminal T403. The sixth NMOS transistor Q405 has a drain terminal connected to the terminal T401, a source terminal connected to a terminal T402, and a gate terminal connected to the output VOUT401 of the first differential amplifying circuit 401. The seventh NMOS transistor Q406 has a drain connected to the terminal T403, a source terminal connected to the terminal T402, and a gate terminal connected to the output CVOUT401 of the first reference voltage generating circuit.

The eighth NMOS transistor Q407 has a drain terminal connected to the terminal T402, a source terminal connected to the ground terminal GND and a gate terminal connected to receive the chip enable signal CE. The fourth PMOS transistor Q408 has a source connected to the power supply terminal VCC, a gate terminal connected to the terminal T403, and a drain terminal connected to the output VOUT401 of the first differential amplifying circuit 401. The ninth NMOS transistor Q409 has a source terminal connected to the ground terminal GND, a gate terminal connected to receive the chip enable signal CE, and a drain terminal connected to the output VOUT401 of the first differential amplifying circuit 401.

The second reference voltage generating circuit 405 is constituted of a fifth PMOS transistor Q410 and a tenth NMOS transistor Q411. The fifth PMOS transistor Q410 has a source terminal connected to the power supply terminal VCC, a gate terminal connected to receive the inverted chip enable signal CEB, and a drain terminal connected to an output CVOUT402 of the second reference voltage generating circuit. The tenth NMOS transistor Q411 has a source terminal connected to the ground terminal GND, and a gate terminal and a drain terminal connected in common to the output CVOUT402 of the second reference voltage generating circuit.

Next, the second differential amplifying circuit 402 includes a sixth PMOS transistor Q412, a seventh PMOS transistor Q413, an eighth PMOS transistor Q417, an eleventh NMOS transistor Q414, a twelfth NMOS transistor Q415, a thirteenth NMOS transistor Q416, and a fourteenth NMOS transistor Q418. Respective source terminals of the sixth PMOS transistor Q412, the seventh PMOS transistor Q413 and the eighth PMOS transistor Q417 are connected to the power supply terminal VCC. The sixth PMOS transistor Q412 has a gate terminal and a drain terminal connected in common to a terminal T404, and the seventh PMOS transistor Q413 has a gate terminal connected to the terminal T404, and a drain terminal connected to a terminal T406. The eleventh NMOS transistor Q414 has a drain terminal connected to the terminal T404, a source terminal connected to a terminal T405, and a gate terminal connected to the output VOUT402 of the second differential amplifying circuit 402. The twelfth NMOS transistor Q415 has a drain connected to the terminal T406, a source terminal connected to the terminal T405, and a gate terminal connected to the output CVOUT402 of the second reference voltage generating circuit. The thirteenth NMOS transistor Q416 has a drain terminal connected to the terminal T405, a source terminal connected to the ground terminal GND and a gate terminal connected to receive the chip enable signal CE. The eighth PMOS transistor Q417 has a source connected to the power supply Terminal VCC, a gate terminal connected to the terminal T406, and a drain terminal connected to the output VOUT402 of the second differential amplifying circuit 402. The fourteenth NMOS transistor Q418 has a source terminal connected to the ground terminal GND, a gate terminal connected to receive the chip enable signal CE, and a drain terminal connected to the output VOUT402 of the second differential amplifying circuit 402.

The third reference voltage generating circuit 406 is constituted of a ninth PMOS transistor Q419 and a fifteenth NMOS transistor Q420. The ninth PMOS transistor Q419 has a source terminal connected to the power supply terminal VCC, a gate terminal connected to receive the inverted chip enable signal CEB, and a drain terminal connected to an output CVOUT403 of the third reference voltage generating circuit. The fifteenth NMOS transistor Q420 has a source terminal connected to the ground terminal GND, and a gate terminal and a drain terminal connected in common to the output CVOUT403 of the third reference voltage generating circuit.

Next, the third differential amplifying circuit 403 includes a tenth PMOS transistor Q421, an eleventh PMOS transistor Q422, a twelfth PMOS transistor Q426, a sixteenth NMOS transistor Q423, a seventeenth NMOS transistor Q424, an eighteenth NMOS transistor Q425, and a nineteenth NMOS transistor Q427. Respective source terminals of the tenth PMOS transistor Q421, the eleventh PMOS transistor Q422 and the twelfth PMOS transistor Q426 are connected to the power supply terminal VCC. The tenth PMOS transistor Q421 has a gate terminal and a drain terminal connected in common to a terminal T407, and the eleventh PMOS transistor Q422 has a gate terminal connected to the terminal T407, and a drain terminal connected to a terminal T409. The sixteenth NMOS transistor Q423 has a drain terminal connected to the terminal T407, a source terminal connected to a terminal T408, and a gate terminal connected to the output VOUT403 of the third differential amplifying circuit 403. The seventeenth NMO.S transistor Q424 has a drain connected to the terminal T409, a source terminal connected to the terminal T408, and a gate terminal connected to the output CVOUT403 of the third reference voltage generating circuit. The eighteenth NMOS transistor Q425 has a drain terminal connected to the terminal T408, a source terminal connected to the ground terminal GND and a gate terminal connected to receive the chip enable signal CE. The twelfth PMOS transistor Q426 has a source connected to the power supply terminal VCC, a gate terminal connected to the terminal T409, and a drain terminal connected to the output VOUT403 of the third differential amplifying circuit 403. The nineteenth NMOS transistor Q427 has a source terminal connected to the ground terminal GND, a gate terminal connected to receive the chip enable signal CE, and a drain terminal connected to the output VOUT403 df the third differential amplifying circuit 403.

An operation of the prior art X decoder circuit shown in FIG. 5 for the multivalued-cell type mask ROM will be described with reference to the detailed circuit of the voltage generating circuit shown in FIG. 4 and a waveform diagram shown in FIG. 6 for illustrating the circuit operation.

Assuming that the threshold of the fifth NMOS transistor Q402 in the first reference voltage generating circuit 404 (FIG. 4) is Vt1 and a current driving capacity of the fifth NMOS transistor Q402 is sufficiently larger than that of the first PMOS transistor Q401, the potential of the output terminal CVOUT401 of the first reference voltage generating circuit 404 is substantially equal to Vt1.

The first differential amplifying circuit 401 receives the output CVOUT401 of the first reference voltage generating circuit 404, and becomes an equilibrated condition when the output VOUT401 of the first differential amplifying circuit 401 and the output CVOUT401 of the first reference voltage generating circuit 404 have become equal in potential. Accordingly, the potential of the output VOUT401 of the first differential amplifying circuit 401 becomes substantially equal to Vt1.

Assuming that the threshold of the tenth NMOS transistor Q411 in the second reference voltage generating circuit 405 is Vt2 and a current driving capacity of the tenth NMOS transistor Q411 is sufficiently larger than that of the fifth PMOS transistor Q410, the potential of the output terminal CVOUT402 of the second reference voltage generating circuit 405 is substantially equal to Vt2.

Since the second differential amplifying circuit 402 operates similarly to the first differential amplifying circuit 401, the potential of the output VOUT402 of the second differential amplifying circuit 402 becomes substantially equal to Vt2.

Assuming that the threshold of the fifteenth NMOS transistor Q420 in the third reference voltage generating circuit 406 is Vt3 and a current driving capacity of the fifteenth NMOS transistor Q420 is sufficiently larger than that of the ninth PMOS transistor Q419, the potential of the output terminal CVOUT403 of the third reference voltage generating circuit 405 is substantially equal to Vt3.

Since the third differential amplifying circuit 403 operates similarly to the first differential amplifying circuit 401, the potential of the output VOUT403 of the third differential amplifying circuit 403 becomes substantially equal to Vt3.

As mentioned above, in the circuit shown in FIG. 5, the output of the first differential amplifying circuit 401 is substantially equal to Vt1, the output of the second differential amplifying circuit 402 is substantially equal to Vt2, and the output of the third differential amplifying circuit 403 is substantially equal to Vt3. By supplying signals having waveforms as shown in FIG. 6, to a pair of inputs φ1 and φ1B of the first transfer gate circuit 504, a pair of inputs φ2 and φ2B of the first transfer gate circuit 505, and a pair of inputs φ3 and φ3B of the first transfer gate circuit 506, respectively, and also by supplying signals having waveforms as shown in FIG. 6, to a pair of inputs XMP1 and XMP1B of the fourth transfer gate circuit 507 of the word line decoding circuit 502, a pair of inputs XMP2 and XMP2B of the fifth transfer gate circuit 508 and a pair of inputs XMPn and XMPnB of the sixth transfer gate circuit 509, respectively, the potential of the first word line WL501 can be changed in a stepped form as shown in FIG. 6.

However, the above mentioned prior art has the following problems:

A first problem is that, in the X decoder circuit shown in FIG. 5, a difference (ΔV) between the generated gate voltage and the threshold voltage of the memory cell transistor is different from one word line to another in accordance with the position of the word line as shown in FIG. 8, with the result that the sense speed becomes low dependently upon the position of the memory cell to be read out.

The reason for this is as follows: In the second reference voltage generating circuit 405 shown in FIG. 4, assuming that the threshold of the tenth NMOS transistor Q411 is Vt2 and the current driving capacity of the tenth NMOS transistor Q411 is sufficiently larger than that of the fifth PMOS transistor Q410, the potential of the output terminal CVOUT402 of the second reference voltage generating circuit 405 becomes substantially equal to Vt2. Therefore, the output potential of the second differential amplifying circuit shown in FIG. 5 becomes substantially equal to Vt2. If the inputs φ2 and φ2B of the second transfer gate circuit 505 are supplied with a high level and a low level, respectively, the output OUT501 of the voltage generating circuit 501 also becomes substantially equal to Vt2.

Here, in a memory cell matrix shown in FIG. 7, it is assumed that all of a first memory cell transistor Q733, a second memory cell transistor Q726, a third memory cell transistor Q719, a fourth memory cell transistor Q712 and a fifth memory cell transistor Q705 were manufactured to have the same threshold Vt1. Actually, however, the threshold of the first memory cell transistor Q733 becomes about Vt1, the threshold of the second memory cell transistor Q726 becomes about Vt1+α1, the threshold of the third memory cell transistor Q719 becomes about Vt1+α2, the threshold of the fourth memory cell transistor Q712 becomes about Vt1+α3, and the threshold of the fifth memory cell transistor Q705 becomes about Vt1+α4.

Here, α1, α2, α3 and α4 are variables changing dependently upon a parasite resistance of a source terminal of the second memory cell transistor Q726, the third memory cell transistor Q719, the fourth memory cell transistor Q712 and the fifth memory cell transistor Q705, and the large-and-small relation of α1, α2, α3 and α4 is expressed by the following expression:

$$\alpha 1 < \alpha 2 < \alpha 3 < \alpha 4 \quad (1)$$

As a result, the larger the source teriinal parasite resistance of the memory cell transistor is, the larger the apparent threshold of the memory cell transistor becomes.

The result of the above mentioned matter is shown in FIG. 8.

As seen by examining FIG. 8, the threshold changes in accordance with the position of the word line to which the gate terminal of the memory cell transistor is connected, and on the other hand, the output of the voltage generating circuit is at constant. Therefore, the sense speed changes dependently upon the position of the word line to which the gate terminal of the memory cell transistor is connected, and in the worst case, a reading error occurs.

SUMMARY OF THE INVENTION

Accordingly, it is an object of the present invention to provide a voltage generation circuit for a multivalued cell type mask ROM, which has overcome the above mentioned problem of the prior art.

Another object of the present invention is to provide a voltage generation circuit for a multivalued cell type mask ROM, for making it possible to read out data, with neither deterioration of the reading speed nor a reading error, and without depending upon the position of the word line connected to the gate terminal of a memory cell transistor concerned, by changing the gate voltage applied to the memory cell transistor, in accordance with the position of the word line connected to the gate terminal of the memory cell transistor concerned.

In order to achieve the above mentioned objects, the voltage generation circuit in accordance with the present invention is associated to memory transistors each located at one of intersections between a plurality of word lines and a plurality of digit lines, each of memory transistors having been programmed, on the basis of data to be written, with any one of a first threshold (Vt0) larger than a ground potential realized by an ion implantation, a second threshold (Vt1) larger than the first threshold, a third threshold (Vt2) larger than the second threshold and a fourth threshold (Vt3) larger than the third threshold, and an X decoder circuit for decoding the memory transistors and having an output connected to the word lines. The voltage generating circuit for controlling the output of the X decoder includes a rank of dummy banks having the same construction as that of a bank which is a basic unit in a memory transistor region where the above mentioned memory transistors are formed, and a gate of a dummy memory transistor included in the rank of dummy banks is connected to the output of the voltage generating circuit when the dummy memory transistor is selected.

Now, an outline of the present invention will be described. In the present invention, the voltage generating circuit preferably includes partial circuits (101 to 105 in FIG. 1) of the same number as the row number of memory cell transistors, and each partial circuit includes a cell part circuit (106 to 110 in FIG. 1). The cell part circuit includes a transistor equivalent to the memory cell transistor and a resistor which is formed to have a resistance equal to a resistance parasitically added to a source terminal and a drain terminal of the memory cell transistor. Each of the partial circuits is supplied with the same signal as that supplied to the corresponding word line, so that the partial circuit equivalent to the memory cell connected to the selected word line is selected, with the result that the voltage generating circuit generates a voltage interlocked with a variation in the threshold caused by a difference between the source potential and the substrate potential.

Next, an embodiment of the present invention will be described. An embodiment of the voltage generating circuit in accordance with the present invention is a voltage generating circuit provided in an X decoder circuit for decoding memory cell transistors each of which is located at one of intersections between a plurality of word lines and a plurality of digit lines and each of which has been programmed, on the basis of data to be written, with any one of a first threshold (Vt0) larger than a ground potential realized by an ion implantation, a second threshold (Vt1) larger than the first threshold, a third threshold (Vt2) larger than the second threshold and a fourth threshold (Vt3) larger than the third threshold. The voltage generating circuit comprises a load MOS transistor (Q101 in FIG. 1) formed of a P-channel enhancement transistor having a source terminal connected to a power supply, a drain terminal connected to an output of the voltage generating circuit, and a gate terminal connected to receive a chip enable signal. A first partial circuit (101 in FIG. 1) connected to the load MOS transistor includes a first selector transistor (Q102 in FIG. 1) having a drain terminal connected to the output (CVOUT101 in FIG. 1) of the voltage generating circuit, a source terminal connected to a first input (T101 in FIG. 1) of a first cell part circuit, and a gate terminal connected to receive a signal supplied to a first word line (W101 in FIG. 1) of a memory cell section, and a second selector transistor (Q104 in FIG. 1) having a drain connected to a second input (T103 in FIG. 1) of the first cell part circuit (106 in FIG. 1), a source terminal connected to ground, and a gate terminal connected in common to the gate terminal of the first selector transistor (Q102 in FIG. 1). The first cell part circuit (106 in FIG. 1) is constituted of a first memory cell transistor (Q103 in FIG. 1) and a first resistor (R101 in FIG. 1). The first resistor has one end connected to the source terminal of the first selector transistor (Q102 in FIG. 1) and the other end connected to a drain of the first memory cell transistor (Q103 in FIG. 1). The first memory cell transistor (Q103 in FIG. 1) has a source terminal connected to the drain terminal of the second selector transistor (Q104 in FIG. 1) and a gate terminal connected to the output (CVOUT101 in FIG. 1) of the voltage generating circuit.

The voltage generating circuit also includes a second partial circuit (102 in FIG. 1) having the same construction as that of the first partial circuit (101 in FIG. 1) and having a second cell part circuit (107 in FIG. 1) which includes a second memory cell transistor (Q106 in FIG. 1), a second resistor (R102 in FIG. 1) and a third resistor (R103 in FIG. 1), differently from the first cell part circuit (106 in FIG. 1). The second resistor has one end (T104 in FIG. 1) connected to a source terminal of a third selector transistor (Q105 in FIG. 1) and the other end (T105 in FIG. 1) connected to a drain terminal of the second memory transistor (Q106 in FIG. 1). The third resistor (R103 in FIG. 1) has one end (T106 in FIG. 1) connected to a source terminal of the second memory cell transistor and the other end connected to a drain terminal of a fourth memory cell transistor (Q107 in FIG. 1). A gate (W102 in FIG. 1) of the second memory cell transistor is connected to the output (CVOUT101 in FIG. 1) of the voltage generating circuit.

The voltage generating circuit further includes a third partial circuit (105 in FIG. 1) having a third cell part circuit (110 in FIG. 1) which is different in construction from the first cell part circuit (the resistor connected to the drain side of the memory cell transistor) and from the second cell part circuit (the resistors connected to the drain side and the source side of the memory cell transistor, respectively). The third cell part circuit includes a third memory cell transistor (Q115 in FIG. 1) and a fourth resistor (R108 in FIG. 1). The fourth resistor has one end (T118 in FIG. 1) connected to a drain terminal of a fifth selector transistor (Q116 in FIG. 1) and the other end (T117 in FIG. 1) connected. to a source terminal of the third memory cell transistor (Q115 in FIG. 1). A drain terminal of the third memory cell transistor is connected to a source terminal of a sixth selector transistor (Q114 in FIG. 1) and a gate ternninal of the third memory cell transistor is connected to the output of the voltage generating circuit.

In a specific embodiment of the present invention, the partial circuits having three different circuit constructions (three different cell part circuit constructions) of the same number as that of the word lines for the memory cells, are connected in parallel, and the selector transistors included each partial circuit are supplied with a signal supplied to a corresponding word line.

Thus, the embodiment of the voltage generating circuit in accordance with the present invention generates the voltage by action of the cell part circuit corresponding to the position of the selected memory cell transistor. Since the cell part circuit has the circuit construction equivalent to a memory cell section, the resistance is added to the source and the drain, similarly to the selected memory cell.

In the embodiment of the voltage generating circuit in accordance with the present invention, accordingly, the variation in the threshold of the memory cell transistor caused by the difference between the source potential and the substrate potential is similarly reproduced in the voltage generating circuit, with the result that the difference between the threshold of the selected memory cell transistor and the output voltage of the voltage generating circuit does not vary dependently upon the position of the selected memory cell transistor.

DESCRIPTION OF THE PREFERRED EMBODIMENTS

Now, embodiments of the voltage generation circuit in accordance with the present invention for a multivalued cell type mask ROM will be described with reference to the accompanying drawings.

Figure 1:
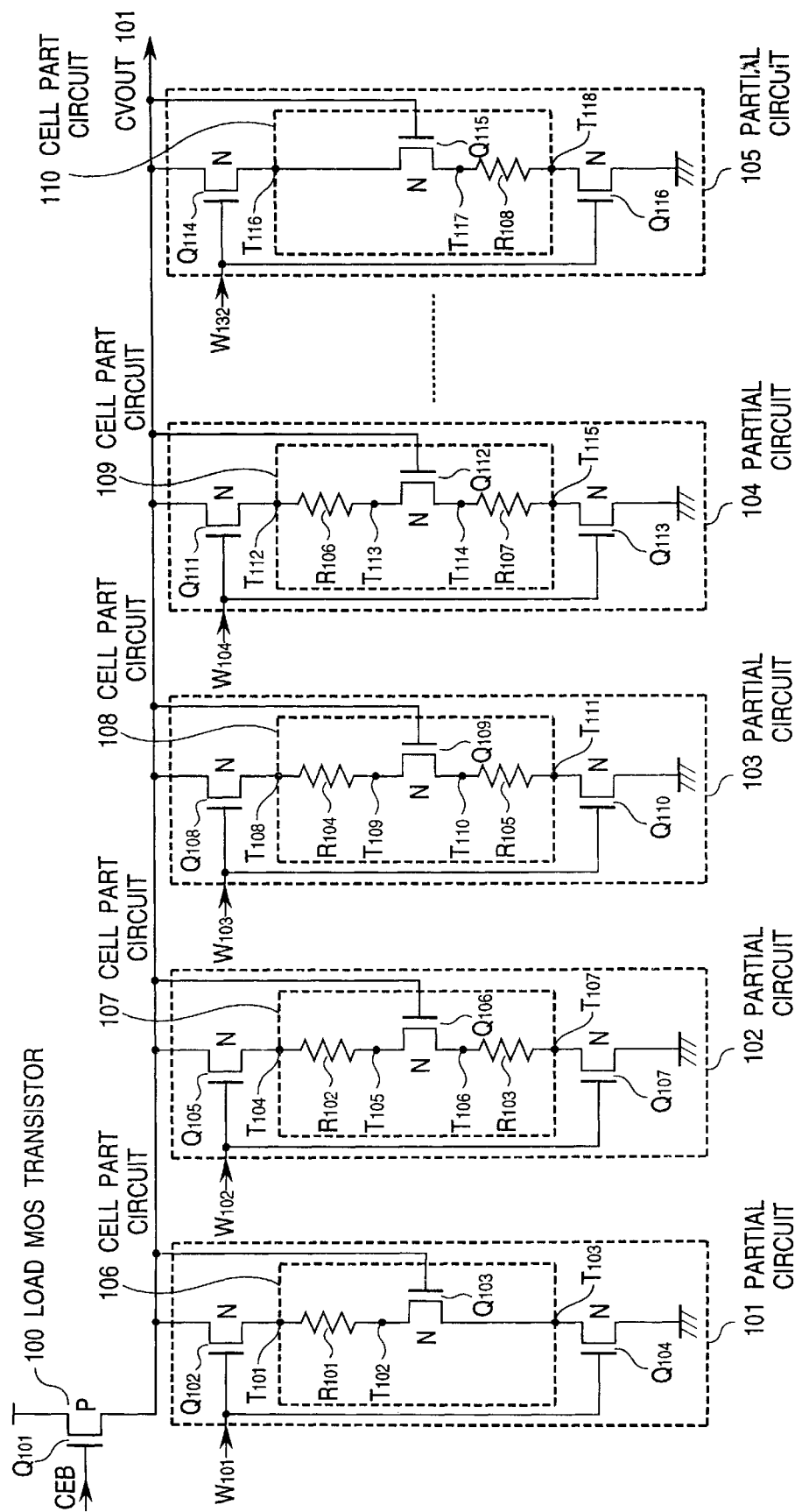
FIG. 1 is a circuit diagram illustrating the circuit construction of one embodiment of the voltage generation circuit in accordance with the present invention for a multivalued cell type mask ROM.

FIG. 1 is a diagram showing the circuit construction of a first embodiment of the voltage generation circuit in accordance with the present invention. Referring to FIG. 1, the embodiment of the voltage generation circuit in accordance with the present invention can be constituted of a load MOS transistor 100 and a partial circuit 101.

The partial circuit comprises a first selector transistor Q102, a cell part circuit 106, a second selector transistor Q104. Gate terminals of the first and second selector transistors Q102 and Q104 are supplied in common with a signal supplied to a word line connected to a gate terminal of a memory cell transistor.

The cell part circuit has three different circuit constructions of a first cell part circuit 106, a second cell part circuit 107 and a third cell part circuit 110.

The first cell part circuit 106 is constituted of a first resistor R101 and a first memory cell transistor Q103.

The second cell part circuit 107 is constituted of a second resistor R102, a second memory cell transistor Q106 and a third resistor R103.

The third cell part circuit 110 is constituted of a third memory cell transistor Q115 and a fourth resistor R108.

The resistance of each of the first to fourth resistors R101, R102, R103 and R104 is the same as the resistance parasitically added to a corresponding memory cell transistor selected, and therefore, the cell part circuits and the partial circuits of the same number as the number of word lines are required.

In each of the partial circuits of the same number as the number of word lines, the selector transistors provided in the partial circuit are connected to a corresponding word line, so that the corresponding word line is selected, it is possible to generate the voltage interlocked with the threshold of the memory cell transistor connected to the corresponding word line.

Figure 3:
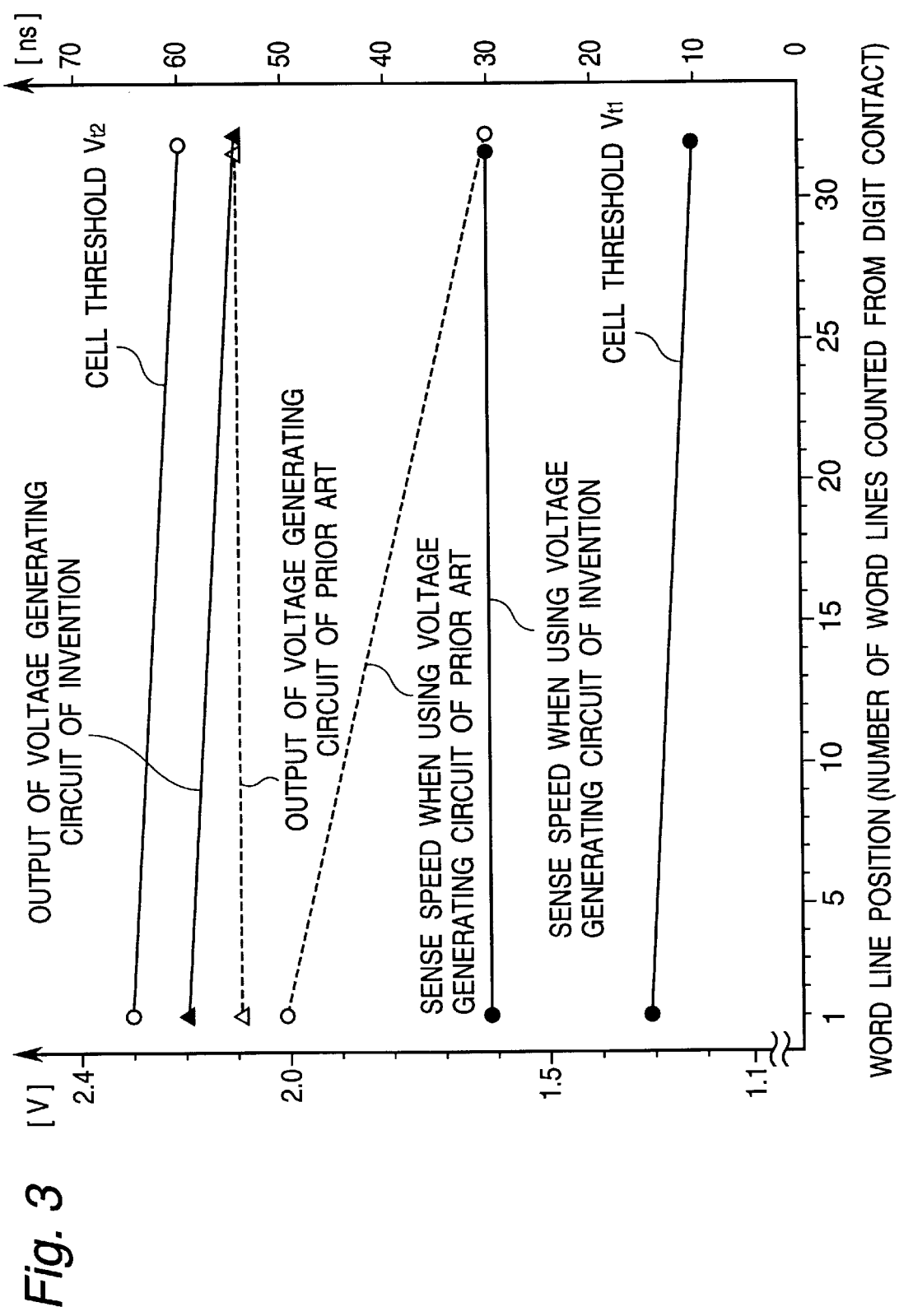
FIG. 3 is a graph illustrating the output voltage and the sense speed of the voltage generation circuit in accordance with the present invention shown in FIG. 1 and the output voltage and the sense speed of the prior art voltage generation circuit as a comparison.
Figure 4:
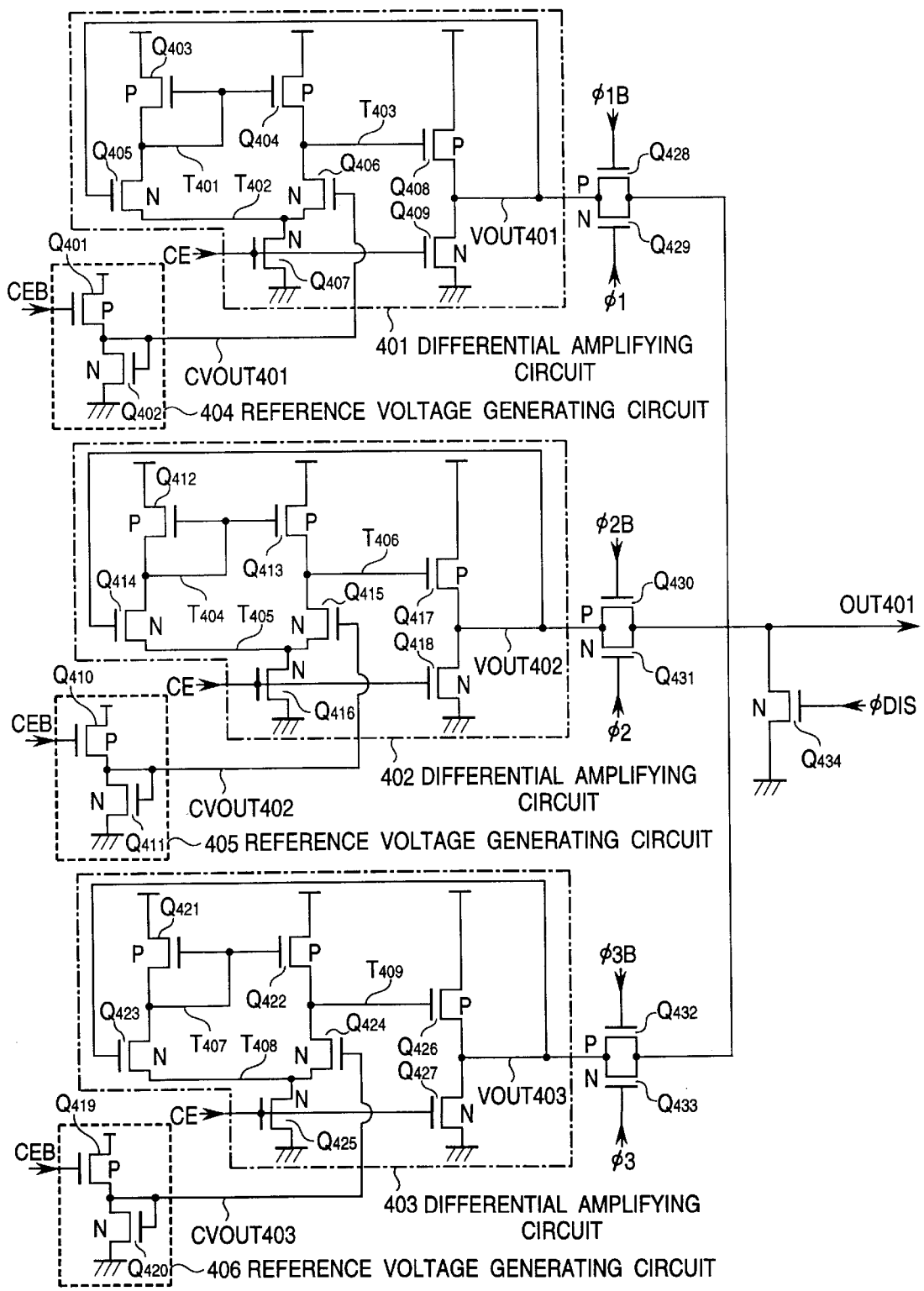
FIG. 4 is a circuit diagram illustrating the circuit construction of the prior art voltage generation circuit.
Figure 5:
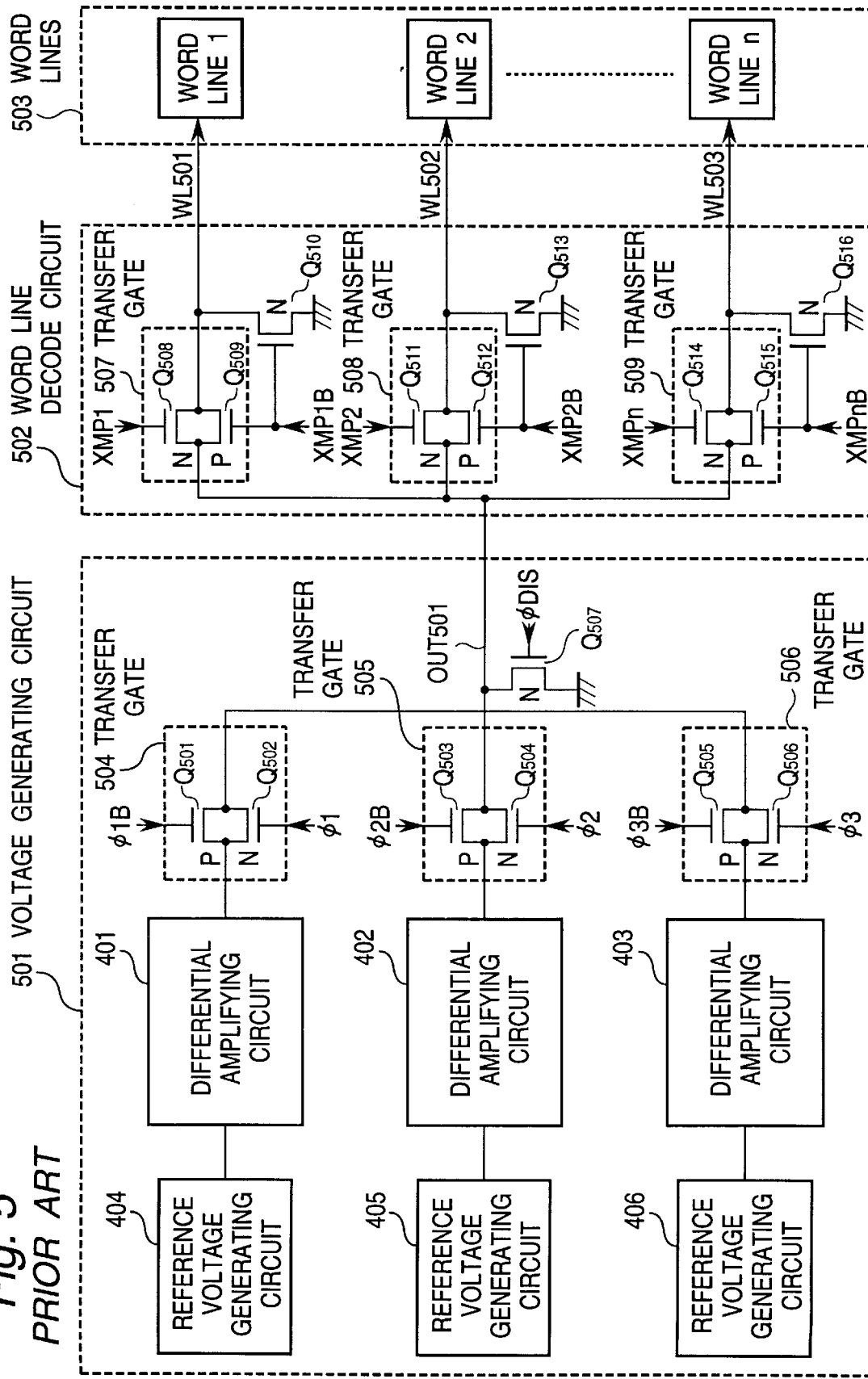
FIG. 5 is a circuit diagram illustrating the circuit construction of the X decoder using the prior art voltage generation circuit.
Figure 6:
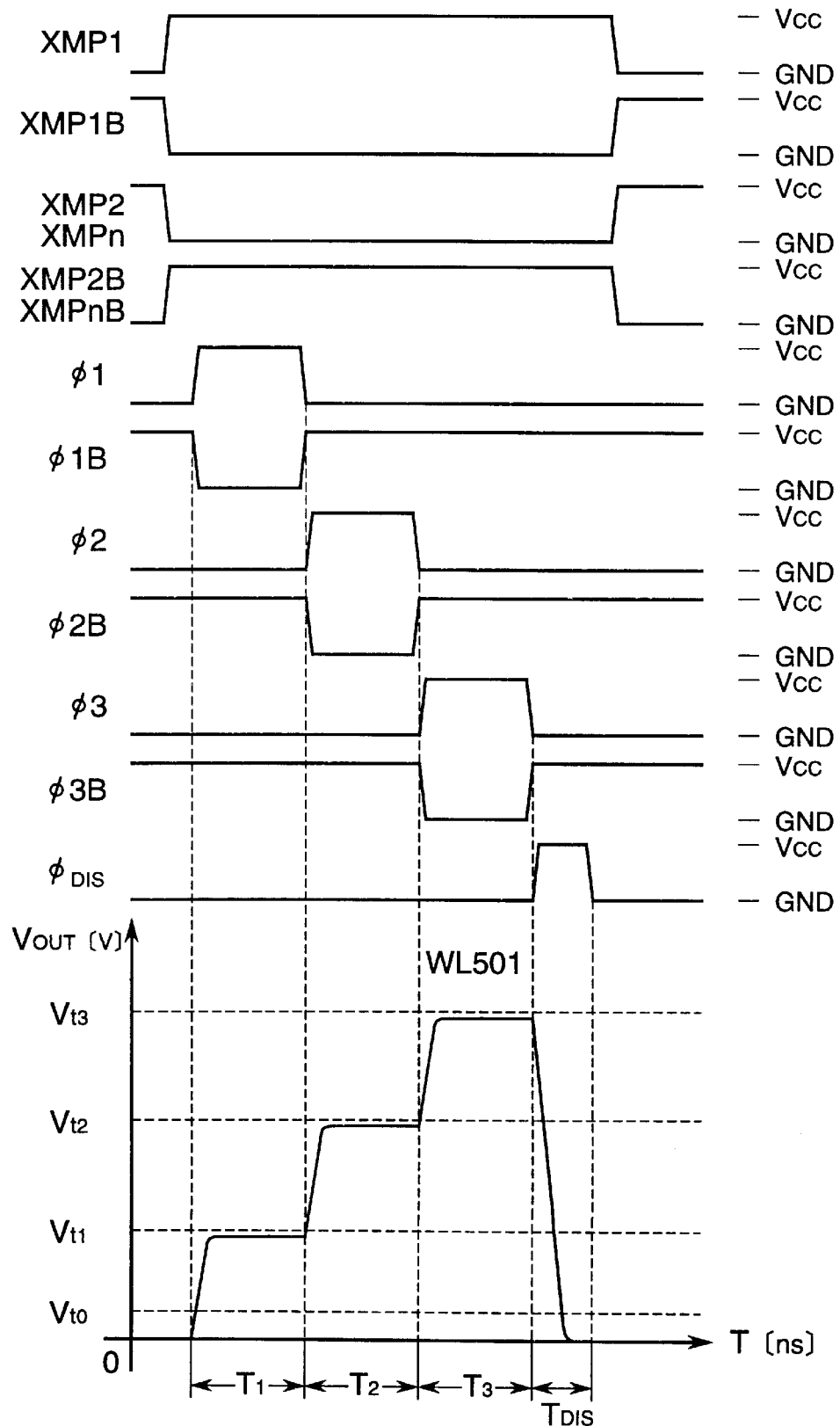
FIG. 6 is a timing chart for illustrating the operation of the prior art X decoder shown in FIG. 5.
Figure 7:
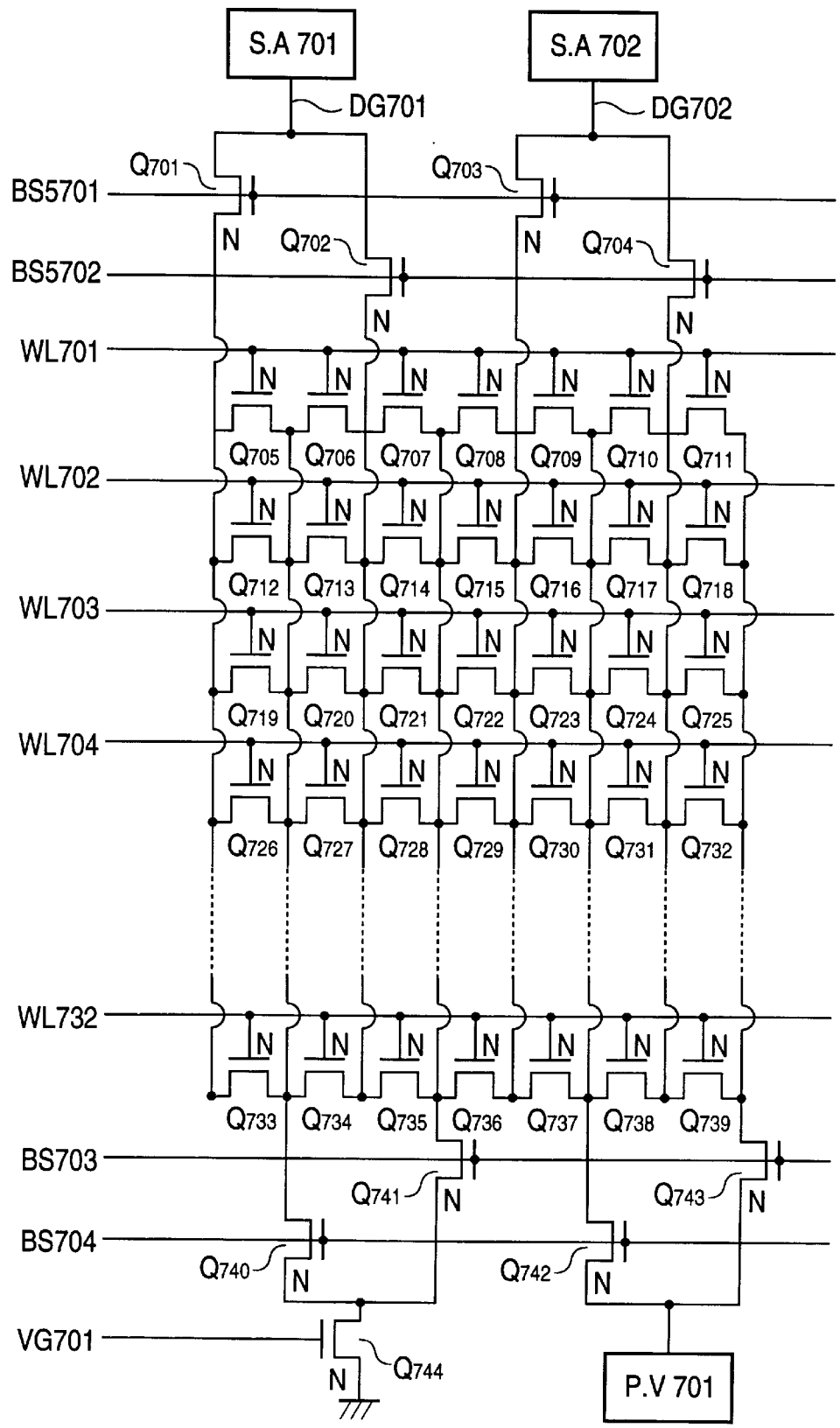
FIG. 7 is a circuit diagram showing an example of the memory cell matrix used in the prior art multivalued cell type mask ROM.
Figure 8:
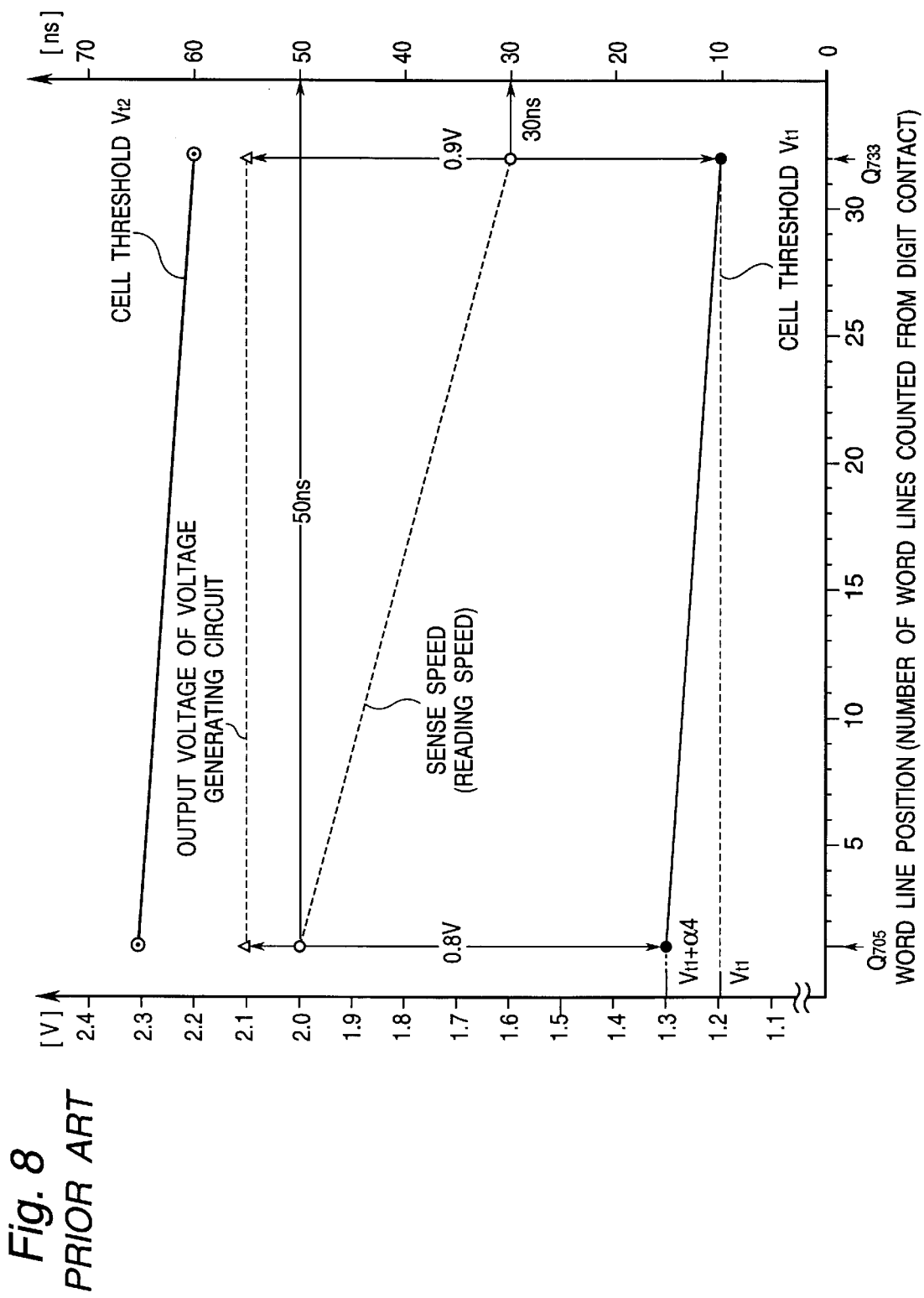
FIG. 8 is a graph illustrating the output voltage and the sense speed of the prior art voltage generation circuit.

FIG. 3 illustrates the output voltage and the sense speed of the first embodiment of the voltage generation circuit in accordance with the present invention, and furthermore, illustrates the output voltage and the sense speed of the prior art voltage generation circuit as a comparison. Now, an operation of the embodiment of the voltage generation circuit in accordance with the present invention will be described with FIG. 1 and FIG. 3.

In operation, the inverted chip enable signal CEB is at a low level, so that the load MOS transistor is rendered conductive. At this time, assume that the word line signal W101 is brought to a high level, and the other word line signals are brought to the low level.

In this case, only the partial circuit 101 is activated, so that the output CVOUT101 of the voltage generating circuit is put in an equilibrated condition with the threshold (Vt2) of the memory cell transistor Q103 provided in the cell part circuit 106 of the partial circuit 101.

Then, if the word line signal W102 is brought to the high level, and the other word line signals are brought to the low level, only the partial circuit 102 is activated, so that the output CVOUT101 of the voltage generating circuit is put in an equilibrated condition with the threshold (Vt2+α1) of the memory cell transistor Q106 provided in the cell part circuit 107 of the partial circuit 102.

Here, the reason for the fact that the threshold of the memory cell transistor Q106 becomes Vt2+α1 in this case, is that the resistance of the resistor R103 is added to the source terminal of the memory cell transistor Q106 so that a difference is created between the source potential and the substrate potential.

Thereafter, if the word line signal W103 is brought to the high level, and the other word line signals are brought to the low level, only the partial circuit 103 is activated, so that the output CVOUT101 of the voltage generating circuit is put in an equilibrated condition with the threshold (Vt2+α2) of the memory cell transistor Q109 provided in the cell part circuit 108 of the partial circuit 103.

Here, the reason for the fact that the threshold of the memory cell transistor Q109 becomes Vt2+α2 in this case, is that the resistance of the resistor R105 is added to the source terminal of the memory cell transistor Q109 so that a difference is created between the source potential and the substrate potential.

As mentioned above, the threshold of the selected memory cell transistor actually varies dependently upon the position of the selected memory cell transistor because the parasite resistance varies dependently upon the position of the selected memory cell transistor. In this embodiment, by positively adding the parasite resistance into the voltage generating circuit, the output voltage of the voltage generating circuit is caused to very dependently upon the position of the selected memory cell transistor, as shown in FIG. 3.

Next, a second embodiment of the voltage generation circuit in accordance with the present invention will be described with reference to FIG. 2.

Figure 2:
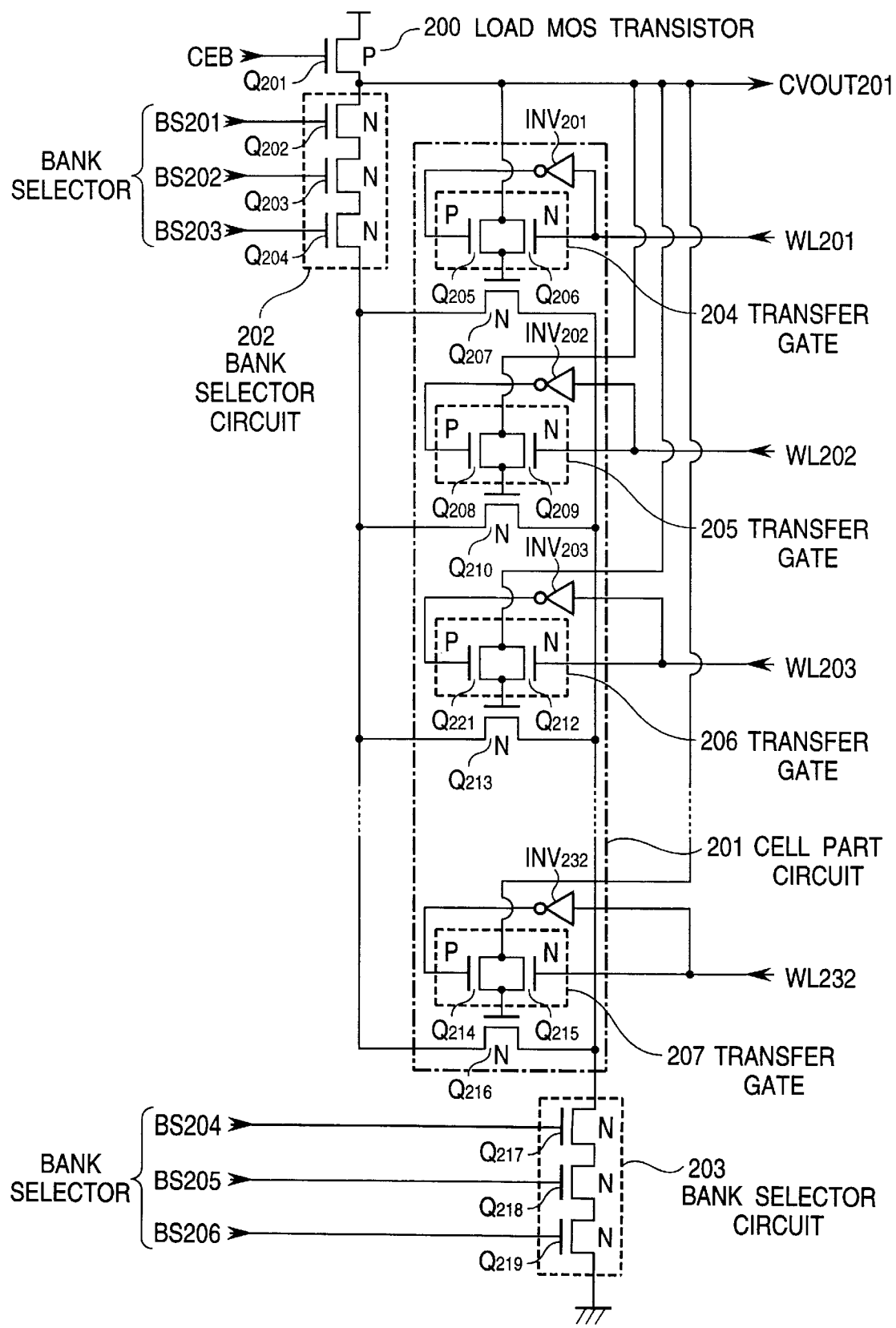
FIG. 2 is a circuit diagram illustrating a circuit construction of another embodiment of the voltage generation circuit in accordance with the present invention for a multivalued cell type mask ROM.

FIG. 2 is a circuit diagram illustrating a circuit construction of the second embodiment of the voltage generation circuit in accordance with the present invention. The second embodiment of the voltage generation circuit in accordance with the present invention includes a load MOS transistor 200, a cell part circuit 201, a first bank selector circuit 202 and a second bank selector circuit 203.

Transistors of the first and second bank selector circuits are constructed to have the same construction and the same dimension as those of bank selector transistors used in a memory cell section, and the cell part circuit 201 includes transistors which have the same construction and the same dimension as those of memory cell transistors used in the memory cell section, and which are of the same number as the row number of the memory cell transistors used in the memory cell section.

The cell part circuit includes a first memory cell transistor Q207 having a gate terminal connected to one end of a first transfer gate 204 which has the other end connected to a drain terminal of the load MOS transistor 200. The drain terminal of the load MOS transistor 200 is connected to an output CVOUT201 of the voltage generating circuit.

A gate terminal of an NMOS transistor Q206 of the first transfer gate circuit 204 is connected to a word line WL201 of the memory cell section, and a gate terminal of a PMOS transistor Q205 is connected to receive through an inverter INV20 the word line WL201.

There are provided circuits each of which has a circuit construction similar to the circuit composed of the first memory cell transistor and the first transfer gate and which are of the same number as the row number of memory cell transistors in the memory cell section. The transfer gate included in each of these circuits is connected to a corresponding word line.

As mentioned above, in this embodiment, completely the same circuit construction as that of the memory cell section is realized, so that the same parasite resistance as that of the memory cell section can be reproduced, and therefore, it is possible to reproduce the variation in the threshold caused dependently upon the position of the selected memory cell transistor, with the result that it is possible to generate the voltage corresponding to the position of the selected memory cell transistor.

As seen from the above, the present invention can obtain an advantage that the voltage generating circuit can generate the output voltage interlocked with the variation in the threshold caused dependently upon the position of the selected memory cell transistor.

The reason for this is that, according to the present invention, the parasite resistance actually occurring in the memory cell section is reproduced in the voltage generating circuit, to reproduce the variation in the threshold occurring in the memory cell section because of the difference between the source potential and the substrate potential.

We claim:

1. A voltage generation circuit for controlling an output of an X decoder in a semiconductor memory having multivalued memory cells, comprising partial circuits equivalent to the number of word lines of said memory cells, each of said partial circuits including a cell part circuit equivalent to a memory cell section of said memory cell, and being connected to receive a signal that is the same signal supplied to a corresponding word line, so that the partial circuit corresponding to the word line of said memory cell is selected to generate an output voltage corresponding to a threshold of a transistor included in the cell part circuit of said selected partial circuit.

2. A voltage generation circuit claimed in claim 1 wherein said transistor included in said cell part circuit comprises a transistor equivalent to a memory cell transistor, and a drain and/or a source of said transistor included in said cell part circuit is added with a resistance equivalent to a parasite resistance of a corresponding memory cell transistor.

3. A voltage generation circuit for controlling an output of an X decoder circuit in a semiconductor memory including memory transistors each located at intersections between a plurality of word lines and a plurality of digit lines, each of said memory transistors having been programmed, on the basis of data to be written, with any one of a first threshold (Vt0) larger than a ground potential realized by an ion implantation, a second threshold (Vt1) larger than the first threshold, a third threshold (Vt2) larger than the second threshold and a fourth threshold (Vt3) larger than the third threshold, and an X decoder circuit for decoding the memory transistors and having an output connected to said word lines, the voltage generating circuit including:

a rank of dummy banks having the same construction as that of a bank which is a basic unit in a memory transistor region where said memory transistors are formed, and a gate of a dummy memory transistor included in said rank of dummy banks being connected to the output of said voltage generating circuit when said dummy memory transistor is selected.

4. A voltage generation circuit claimed in claim 3 further including a load MOS transistor formed of a P-channel enhancement transistor having a source terminal connected to a power supply, a drain terminal connected to the output of the voltage generating circuit, and a gate terminal connected to receive a chip enable signal, and a first partial circuit connected to said load MOS transistor, wherein said first partial circuit includes a first selector transistor having a drain terminal connected to the output of the voltage generating circuit, a source terminal connected to a first input of a first cell part circuit, and a gate terminal connected to receive a signal supplied to a first word line of the memory cell section, and a second selector transistor having a drain connected to a second input of said first cell part circuit, a source terminal connected to ground, and a gate terminal connected in common to said gate terminal of said first selector transistor, said first cell part circuit being constituted of a first memory cell transistor and a first resistor, said first resistor having one end connected to the source terminal of said first selector transistor and the other end connected to a drain of said first memory cell transistor, and said first memory cell transistor having a source terminal connected to the drain terminal of said second selector transistor and a gate terminal connected to the output of the voltage generating circuit, the voltage generating circuit also including:

a second partial circuit having the same construction as that of said first partial circuit, said first cell part circuit of said second partial circuit including a second memory cell transistor, a second resistor and a third resistor, differently from the said cell part circuit, said second resistor having one end connected to a source terminal of a third selector transistor and the other end connected to a drain terminal of said second memory transistor, said third resistor having one end connected to a source terminal of said second memory cell transistor and the other end connected to a drain terminal of a fourth memory cell transistor, a gate of said second memory cell transistor being connected to the output of the voltage generating circuit; and a third partial circuit having the same construction as that of said first partial circuit, said first cell part circuit of said third partial circuit including a third memory cell transistor and a fourth resistor, said fourth resistor having one end connected to a drain terminal of a fifth selector transistor and the other end connected to a source terminal of said third memory cell transistor, a drain terminal of said third memory cell transistor being connected to a source terminal of a sixth selector transistor and a gate terminal of the third memory cell transistor being connected to the output of the voltage generating circuit, wherein said partial circuits of the above mentioned three circuit constructions are connected in parallel in the same number as the number of said word lines of said memory transistors, and each of said partial circuits is supplied with a signal supplied to a corresponding one of said word lines of said memory transistors, to generate a voltage corresponding to the position of the corresponding word line.

5. A voltage control generation circuit claimed in claim 3 further including partial circuits of the same number as the number of word lines in a memory cell section of a memory cell, said partial circuits being cascaded, and said partial circuits including a first partial circuit which includes a memory cell transistor, a first transfer gate circuit and a first inverter circuit, said first transfer gate circuit includes a first NMOS transistor and a first PMOS transistor, a source terminal and a drain terminal of said first NMOS transistor being connected to a source terminal and a drain terminal of said first PMOS transistor, respectively, the common-connected source terminals of said first NMOS transistor and said first PMOS transistor being connected to the gate terminal of said memory cell transistor, the common-connected drain terminals of said first NMOS transistor and said first PMOS transistor being connected to the output of the voltage generating circuit, a gate terminal of said first NMOS transistor being connected to a first word line of the memory cell section, said first word line of the memory cell section being connected to a first inverter, which has an output connected to a gate terminal of said first PMOS transistor, each of said partial circuits being supplied with a signal supplied to a corresponding one of said word lines in the memory cell section, to generate a voltage corresponding to the position of the corresponding word line.

* * * * *

UNITED STATES PATENT AND TRADEMARK OFFICE
CERTIFICATE OF CORRECTION

PATENT NO. : 6,108,247
DATED : August 22, 2000
INVENTOR(S) : Takayuki SUZU, Kenji HIBINO It is certified that error appears in the above-identified patent and that said Letters Patent is hereby corrected as shown below:

Column 1, line 41, delete "conunon" insert --common--

Column 3, line 60, delete "NMO.S" insert --NMOS--

Column 4, line 8, delete "df" insert --of--

Column 5, line 55, delete "teriinal" insert --terminal--

Signed and Sealed this

Twenty-fourth Day of April, 2001

Attest:

NICHOLAS P. GODICI

Attesting Officer

Acting Director of the United States Patent and Trademark Office